(12) United States Patent
Fujii

(10) Patent No.: US 6,372,531 B1
(45) Date of Patent: Apr. 16, 2002

(54) SEMICONDUCTOR DEVICE AND FABRICATION PROCESS THEREFOR

(75) Inventor: Hidenori Fujii, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/663,932

(22) Filed: Sep. 18, 2000

(30) Foreign Application Priority Data

Apr. 3, 2000  (JP) ............................................ 12-100612

(51) Int. Cl.⁷ ................................................ H01L 21/00
(52) U.S. Cl. ........................................ 438/21; 438/425
(58) Field of Search ........................... 438/21, 201, 211, 438/257, 258, 259, 265, 266, 439, 448, 67, 72, 425, 427, 433

(56) References Cited

U.S. PATENT DOCUMENTS 5,445,989 A  *  8/1995  Lur et al. .................... 438/425
5,489,799 A  *  2/1996  Zambrano et al. .......... 257/587
5,544,103 A  *  8/1996  Lambertson ........... 365/185.15
6,136,648 A  * 10/2000  Oya ............................ 438/257

FOREIGN PATENT DOCUMENTS

JP          9-283787          10/1997
JP          11-46010          2/1999

* cited by examiner

Primary Examiner—David Nelms
Assistant Examiner—Phuc T. Dang
(74) Attorney, Agent, or Firm—McDermott, Will & Emery

(57) ABSTRACT

A plurality of photo diodes PD1 to PD4 are formed on a p-type silicon substrate. The photo diodes PD1 to PD4 are electrically isolated from one another by lower and upper isolation regions 3 and 5. Arms of strip portions of each of the lower and upper isolation regions 3 and 5 are narrowed in width toward the center of an intersection of the strip portions in a plane. Thereby, there can be provided a semiconductor device which can efficiently convert laser light for illumination to photovoltage.

7 Claims, 20 Drawing Sheets

SEMICONDUCTOR DEVICE AND FABRICATION PROCESS THEREFOR

BACKGROUND OF THE INVENTION

1. Field of the Invention

The present invention relates to a semiconductor device and a fabrication process therefor and particularly, to a semiconductor device having an isolation region and a fabrication process therefor.

2. Description of the Background Art

As an example of a conventional semiconductor device, photo diodes applied in IC for an optical pickup of a compact disc (CD) will be described. As shown in FIGS. 25 and 27, a plurality of photo diodes PD11 to PD14 are first formed on a p-type silicon substrate 101. The photo diodes PD11 to PD14 are electrically isolated from one another by lower and upper isolation regions 103 and 105, strip portions of each of which intersect with each other in a plane.

In a region where the photo diodes PD11 to PD14 are formed, an n-type epitaxial layer 104 is formed on the p-type silicon substrate 101 with an $N^+$-type buried region 102 interposed therebetween. On the n-type epitaxial layer 104, a p-type layer 106 is formed.

Electrons and holes are generated in a depletion layer expanded from the junction interface between the p-type layer 106 and the n-type epitaxial 104. Electrons are migrated into the n-type epitaxial layer 104 under an electric field in the depletion layer, while holes are migrated into the p-type layer 106, to thus produce a potential difference between the n-type epitaxial layer 104 and the p-type layer 106.

Further, similar to the above described case, a potential difference is produced between the $N^+$-type buried region 102 and the p-type silicon substrate 101 by electrons and holes generated in a depletion layer expanding from the junction interface between the $N^+$-type buried region 102 and the p-type silicon substrate 101. With such a potential difference, a photovoltage is produced. In such a way, a current generated in each of the photo diodes PD11 to PD14 is amplified by a predetermined circuit (not shown).

Then, of a fabrication process for the above described semiconductor device, especially a method, by which the lower and upper isolation regions 103 and 105 are formed, will be explained. First, in a predetermined region of the p-type silicon substrate 101, a p-type impurity used for forming the lower isolation region 103 is implanted by an ion-implantation method, followed by a predetermined heat treatment.

Then, the n-type epitaxial layer 104 is formed on the p-type silicon substrate 101. With such steps applied, as shown in FIG. 28, a region 103a to serve as a lower isolation region, is formed. Thereafter, a p-type impurity is ion-implanted on a surface of the n-type epitaxial layer 104 above the region 103a and a predetermined heat treatment is applied to produce a region 105a to serve as an upper isolation region 105, as shown in FIG. 29. Thereby, other transistors and so on, which are not shown in the figure, are formed on the p-type silicon substrate 101 to thus complete a semiconductor device having photo diodes.

However, in the above described fabrication process for a semiconductor device, there has been a problem described below. After the region 103a to serve as the lower isolation region 103 is formed, an impurity in the region 103a diffuses in all directions during a heat treatment to form the region 105a to serve as the upper isolation region 105.

Further, after the region 105a is formed, heat treatments during formation of impurity regions of other transistors not shown diffuse impurities of the region 105a in all directions. As a result of such diffusion, as shown in FIG. 25, in a semiconductor device completed after predetermined heat treatments, the isolation region in a section around an intersection of strip portions of the lower isolation region 103 or the upper isolation region 105 expands in size compared with its original one because of diffusion from adjacent parts to the section around the intersection.

On the other hand, a spot diameter of a laser light beam with which the photo diodes PD11 to PD14 are illuminated is limited and has a intensity distribution as shown in FIG. 26 for example. Electron-hole pairs generated by a laser light beam are in situ recombined since almost no depletion layer is formed in the isolation regions 103 and 105.

For this reason, a laser light beam with which the isolation regions 103 and 105 are illuminated contributes to almost no generation of a photovoltage. As described above, in the section around an intersection of strip portions of the lower isolation region 103 or the upper isolation region 105, the isolation region expands in size compared with its original one by heat treatments in a fabrication process.

At this time, when the isolation regions 103 and 105 are illuminated with a laser light beam such that illumination by a light beam spot A as shown in FIG. 25 covers the sections around an intersection of strip portions of the isolation regions 103 and 105, a light component contributing to generation of a photovoltage decreases and thereby, a problem arises since high accuracy information become hard to obtain by the photo diodes as an optical pickup device.

SUMMARY OF THE INVENTION

The present invention has been made in order to solve the above problems. It is an object of the present invention to provide a semiconductor device with a high photovoltage generation efficiency and it is another object of the present invention to provide a fabrication process for such a semiconductor device.

A first semiconductor device of an aspect of the present invention, including an isolation region having strip portions that intersect with each other in a plane, is provided with a first conductivity type semiconductor substrate, a second conductivity type layer and a first conductivity type layer. The second conductivity type layer is formed on the semiconductor substrate. The first conductivity type layer is formed on the second conductivity type layer. The isolation region is formed from a surface of the first conductivity type layer to a surface of the semiconductor substrate and partitions the first conductivity type and second conductivity type layers into a plurality of regions. Arms of strip portions of the isolation region are narrowed in width toward a center of an intersection of the strip portions in a section around the intersection.

According to the semiconductor device, since arms of strip portions of an isolation region are narrowed in width toward a center of an intersection of the strip portions in a section around the intersection, a depletion layer at the interface between the first and second conductivity type layers can expand more toward the intersection of the strip portions compared with a conventional semiconductor device. Further, similar to the above described case, a depletion layer at the interface between the semiconductor substrate and the second layer can expand more. With the expansion of the depletion layers, even when illumination with a laser light beam covers a section around an intersection of the strip portions, no electron-hole pairs generated in a depletion layer are in situ recombined under an electric field in the depletion layer expanding close to the section around the intersection, which can contribute to generation of photovoltage.

A second semiconductor device of an aspect of the present invention, including an isolation region having strip portions that intersect with each other in a plane, is provided with a first conductivity type semiconductor substrate, a second conductivity type layer and a first conductivity type layer. The second conductivity type layer is formed on the semiconductor substrate. The first conductivity type layer is formed on the second conductivity type layer. The isolation region includes lower and upper isolation regions and is formed from a surface of the first conductivity type layer to a surface of the semiconductor substrate and partitions the first conductivity type and second conductivity type layers into a plurality of regions. Arms of strip portions of at least one of the lower and upper isolation regions are narrowed in width toward a center of an intersection of the strip portions in a section around the intersection.

According to the semiconductor device, since arms of strip portions of at least one of the lower isolation region and the upper isolation region are narrowed in width toward a center of an intersection of region strips of the at least one in a section around the intersection, particularly, at least one of depletion layers at the interfaces between the first conductivity type semiconductor substrate and the second conductivity layer, and between the second conductivity layer and the first conductivity layer can expand more compared with a conventional device. With the expanded depletion layers, even when illumination with a laser light beam covers a section around the intersection of the strip portions of each of the upper and lower isolation regions, no electron-hole pairs generated in the depletion layer are in situ recombined under an electric field in the depletion layer expanding close to the section around the intersection of the strip portions thereof, which can contribute to generation of photovoltage.

Arms of strip portions of each of the lower and upper isolation regions are preferably narrowed in width toward a center of an intersection of the strip portions in a section around the intersection.

In this case, both depletion layers can expand toward sections around intersections of strip portions of the upper and lower isolation regions, respectively. With expansion of the depletion layers, even when illumination with a laser light beam covers the section around the intersection of the strip portions of each of the upper and lower isolation regions, no electron-hole pairs generated in the depletion layer are in situ recombined under an electric field in the depletion layer expanding close to the section around the intersection of the strip portions thereof, which can contribute to generation of photovoltage.

A third semiconductor device of an aspect of the present invention, including an isolation region having strip portions that intersect with each other in a plane, is further provided with a first conductivity type semiconductor substrate, a second conductivity type layer and the first conductivity type layer. The second conductivity type layer is formed on the semiconductor substrate. The first conductivity type layer is formed on the second conductivity type layer. The isolation region is formed from a surface of the second conductivity type layer to a surface of the semiconductor substrate, and partitions the first conductivity type and second conductivity type layers into a plurality of regions. Fore-ends of arms of strip portions of an isolation region directed to the center of an intersection of the strip portions thereof are integrally connected with one another in the vicinity of sides of the fore-ends of the arms in a section around the interconnection.

According to the semiconductor device, since the fore-ends directed to the center of an intersection of strip portions of the isolation region are integrally connected with one another in the vicinity of sides of the fore-ends of the arms in a section around the intersection, the depletion layers at the interfaces between the first and second conductivity type layers, and between the first conductivity type semiconductor substrate and the second conductivity type layer can expand more toward the respective intersections compared with a conventional semiconductor device. With the expanded depletion layers, even when illumination with a laser light beam covers the section around the intersection of the strip portions of the isolation region, no electron-hole pairs generated in the depletion layers are in situ recombined under electric fields in the depletion layers expanding close to the section around the intersection of the strip regions thereof, which can contributes to generation of photovoltage.

A fabrication process for a semiconductor device of a second aspect of the present invention is a fabrication process for a semiconductor device including an isolation region having strip portions that intersect with each other in a plane, includes the following steps of: forming a second conductivity type layer on a first conductivity type semiconductor substrate; forming, in said second conductivity type layer, a first conductivity type region to serve as an isolation region for partitioning the second conductivity type layer into a plurality of regions, from a surface of the second conductivity type layer to a surface of the semiconductor substrate; and forming a first conductivity type layer on and in the vicinity of the second conductivity type layer partitioned by the first conductivity type region, wherein the step of forming the first conductivity type region includes a step of forming the first conductivity type region such that fore-ends of respective opposed arms of each strip portion are spaced by a predetermined gap in the vicinity of a designed intersection of the strip portions of the isolation region. The predetermined gap is a distance over which the isolation region is partially formed connected between the fore-ends of the opposed arms after a final step of the fabrication process is completed.

According to this fabrication process, since when the first conductivity type region to serve as an isolation region is formed, a distance with which the fore-ends of opposed arms of respective strip regions is spaced, in a section around a designed intersection of the strip portions of the isolation region, so as to be equal to one over which said isolation region is partially formed connected between the fore-ends of the opposed arms after a final step of the fabrication process is completed, therefore the isolation region can be prevented from being larger in the section around the intersection of strip portions of the isolation region compared with a conventional fabrication process for a semiconductor device. With such a process adopted, even when illumination with a laser light beam covers a section around the intersection of the strip portions of the isolation region, no electron-hole pairs generated at a depletion layer are in situ recombined under an electric field in the depletion layer expanding close to the section around the intersection of the strip regions thereof, thus making it possible to attain a semiconductor device to efficiently generate photovoltage.

The step of forming the first conductivity type region preferably includes a step of forming fore-ends of arms of strip portions thereof so as to be narrowed in width toward the center of a designed intersection of the strip portions, in the vicinity of the designed intersection.

In this case, in a section around the designed intersection of strip portions of the first conductivity type region, opposed fore-ends narrowed in width toward the respective tips of arms of the strip portions are coalesced at a final stage to integrally form an isolation region. With formation of such an isolation region, the depletion layers at the interfaces between the first and second conductivity type layer, and between the first conductivity type semiconductor substrate and the second conductivity type layer can expand toward the intersections of strip portions. As a result, even when illumination with a laser light beam covers a section around the intersections of the strip portions of the isolation region, a photovoltage is generated in a stable manner.

Further, the step of forming the first conductivity type region preferably includes a step of forming the first conductivity type region such that fore-ends of arms of strip portions thereof directed to the center of an designed intersection of the strip portions of an isolation region are integrally connected with one another in the vicinity of sides of the fore-ends at a final stage in a section around the designed intersection.

In this case as well, an isolation region is prevented from being larger in width in a section around a designed intersection of strip portions thereof and even when illumination with a laser light beam covers the section around the intersection of the strip portions of the isolation region, such prevention of the isolation region from being larger can contributes to generation of photovoltage.

Further, when the first conductivity type region is formed as two regions of a lower region and an upper region separately, the lower region formed earlier receives an influence of a heat treatment more than the upper region formed later. For this reason, gaps between the opposed fore-ends of arms of strip portions of the lower regions are desirably set to be larger in width than ones between the fore-ends of opposed arms of strip portions of the upper region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

As an example of a semiconductor device relating an embodiment of the present invention, description will be made of a semiconductor device having photo diodes applied in IC for an optical pickup of a compact disc (CD) and a fabrication process therefor. First, the semiconductor device is described.

Figure 1:
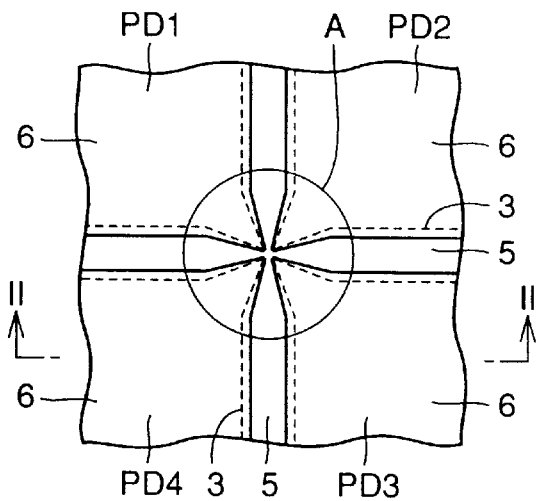
FIG. 1 is a plan view of a semiconductor device relating to an embodiment of the present invention.
Figure 2:
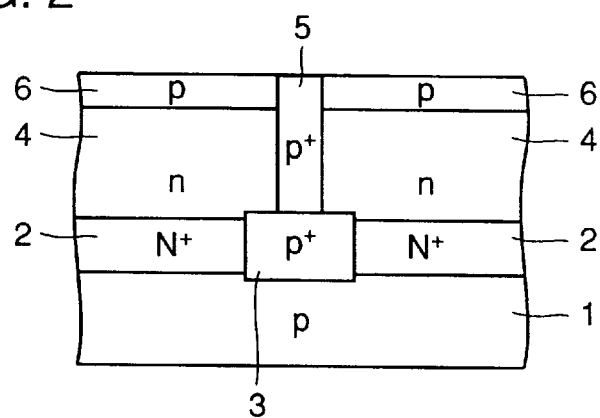
FIG. 2 is a sectional view taken on line II—II shown in FIG. 1.

As shown in FIGS. 1 and 2, a plurality of photo diodes PD1 to PD4 are formed on a p-type silicon substrate 1. Each of the photo diodes PD1 to PD4 are electrically isolated by lower and upper isolation regions 3 and 5, strip portions of each of which intersect with each other in a plane, formed on the p-type silicon substrate 1.

An n-type epitaxial layer 4 is formed on a surface of the p-type silicon substrate 1 which surface is partitioned by the lower and upper isolation regions 3 and 5, with an $N^+$-type buried region 2 interposed therebetween. A p-type layer 6 is formed on the n-type epitaxial layer 4. Arms of strip portions of each of the lower and upper isolation regions 3 and 5 are both narrowed in width toward the center of an intersection of the strip portions in a section around the intersection.

In the above described semiconductor device, when the device is illuminated with a laser light, electrons and holes are generated in the depletion layer expanding from the junction interface between the p-type layer 6 and the n-type epitaxial layer 4 and emigrate in the depletion layer into the n-type-epitaxial layer 4 and the p-type layer 6, respectively, under an influence of an electric field in the depletion layer to produce a potential difference between the layers 4 and 6.

Further, similar to the above case, electrons and holes are generated in the depletion layer expanding from the junction interface between the $N^+$-type buried region 2 and the p-type silicon substrate 1 and emigrate in the depletion layer into the $N^+$-type buried region 2 and the p-type silicon substrate 1, respectively, under an influence of an electric field in the depletion layer to generate a potential difference between the $N^+$-type buried region 2 and the substrate 1. It should be noted that in the upper and lower isolation regions 5 and 3, electron-hole pairs generated by illumination of laser light are in situ recombined and no photovoltage is produced.

Figure 3:
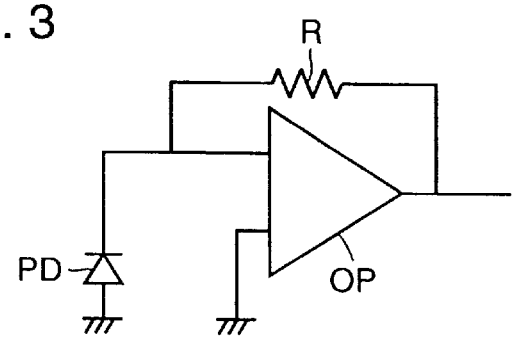
FIG. 3 is a diagram showing configuration of a basic circuit for an optical pickup device in which photo diodes are incorporated, in the embodiment.

In such a manner, a photovoltage is produced in each of the photo diodes PD1 to PD4. Currents produced in the photo diodes PD1 to PD4 are amplified with an operational amplifier OP. FIG. 3 is a diagram showing a configuration of a basic circuit of IC in an optical pickup for DVD.

In the semiconductor device having the photo diodes PD1 to PD4, arms of strip portions of each of the lower and upper isolation regions 3 and 5, as described above, are narrowed in width toward the center of an intersection of the strip portions. With such a structure, the depletion layer at the interface between the p-type layer 6 and the n-type epitaxial layer 4 can expand more toward a section around an intersection of the strip portions of the upper isolation region 5 compared with a conventional semiconductor device. Further, similar to the above described case, the depletion layer expanding from the interface between the p-type silicon substrate 1 and the $N^+$-type buried region 2 can also expand toward a section around an intersection of strip portions of the lower isolation layer 3.

As a result, like a light beam spot A as shown in FIG. 1, even when illumination with a laser light beam covers the section around the intersection of the strip portions of each of the upper and lower isolation regions 5 and 3 as well, photovoltage is produced with good efficiency by electrons and holes generated. Further, since photovoltage is generated with good efficiency, a current follow-up capability to a change in light intensity of laser light is improved, for example.

Further, in this embodiment, arms of strip portions of each of the lower and upper isolation regions 3 and 5 are narrowed in width toward the center of an intersection of the strip portions. In addition to this, an alternative structure may be adopted in which arms of strip portions of one of the lower and upper isolation regions 3 and 5 are narrowed in width toward the center of an intersection of the strip portions.

Especially when the device is illuminated with a laser light beam having a comparatively long wavelength, photovoltage is produced mainly by an electric field in the depletion layer expanding from the interface between the $N^+$-type buried region 2 and the p-type silicon substrate 1. Therefore, in this case, arms of strip portions of the lower isolation region 3 are preferably narrowed in width toward the center of an intersection of the strip portions in a section around the intersection.

On the other hand, in a case where a wavelength of a laser light beam used for illumination is short in a comparative sense, photovoltage is mainly produced by an electric field in the depletion layer expanding from the interface between the p-type layer 6 and the n-type epitaxial layer 4. Therefore, in this case, arms of strip portions of the upper isolation region 5 are preferably narrowed in width toward the center of an intersection of the strip portions in a section around the intersection.

In this way, the shapes of sections around the intersections of the strip portions of respective both isolation regions 3 and 5 can also be selected in a corresponding manner to a wavelength of a laser light beam for illumination.

Figure 4:
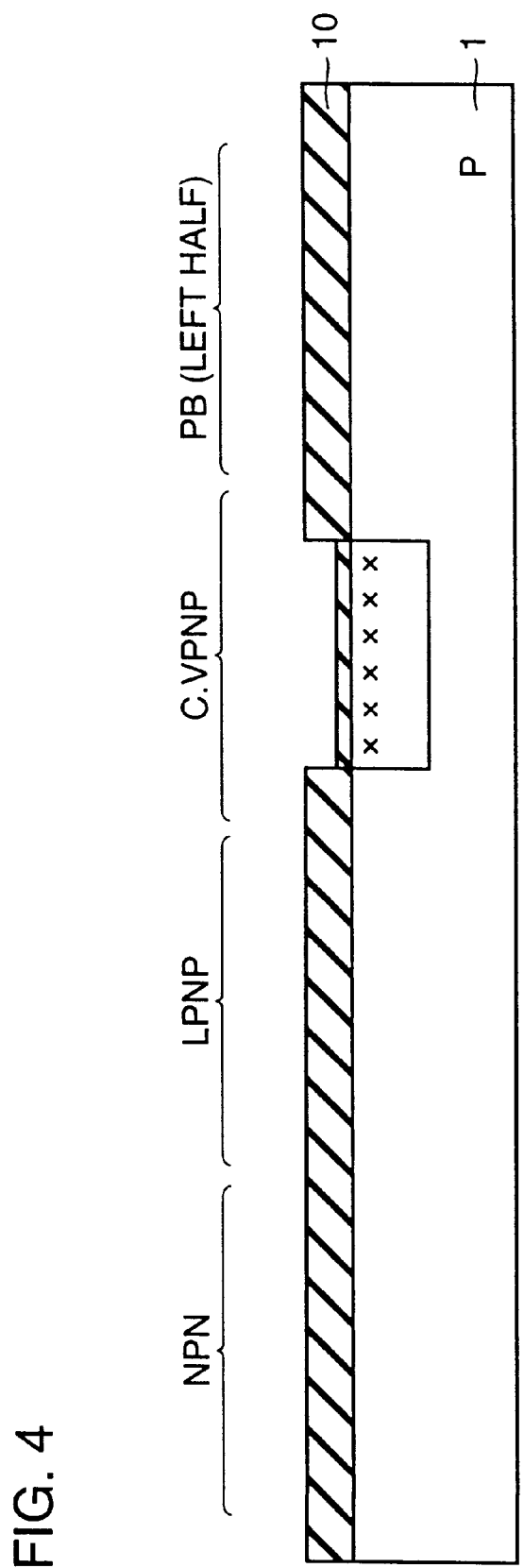
FIG. 4 is a sectional view showing a step of a fabrication process of the semiconductor device relating to an embodiment of the present invention.

Then, description will be made of an example of the fabrication process for a semiconductor device including the above described photo diodes. First, as shown in FIG. 4, a silicon oxide film 10 is formed on a surface of a p-type silicon substrate 1 to a thickness of about 600 nm. Part of the surface of the p-type silicon substrate 1 is exposed by applying a predetermined photolithographic treatment and etching on the silicon oxide film 10.

Not only is phosphorous ion-implanted in an exposed surface region of the p-type silicon substrate under: conditions of an implant energy of 120 KeV and an implant dose of $5\times10^{14}/cm^2$, but a heat treatment is also applied at about 1200° C. for about 30 min. With this procedure, an $N^-$-type buried layer 11 is formed.

It should be noted that in the p-type silicon substrate 1, a region (a half) where photo diodes are formed is represented by PB, a region where a common vertical PNP transistor is formed is represented by C. VPNP, a region where a lateral PNP transistor is formed is represented by a LPNP and a region where a bipolar NPN transistor is formed is represented by NPN. These transistors constitute an operational amplifier OP and so on of an optical pickup basic circuit shown in FIG. 3.

Figure 5:
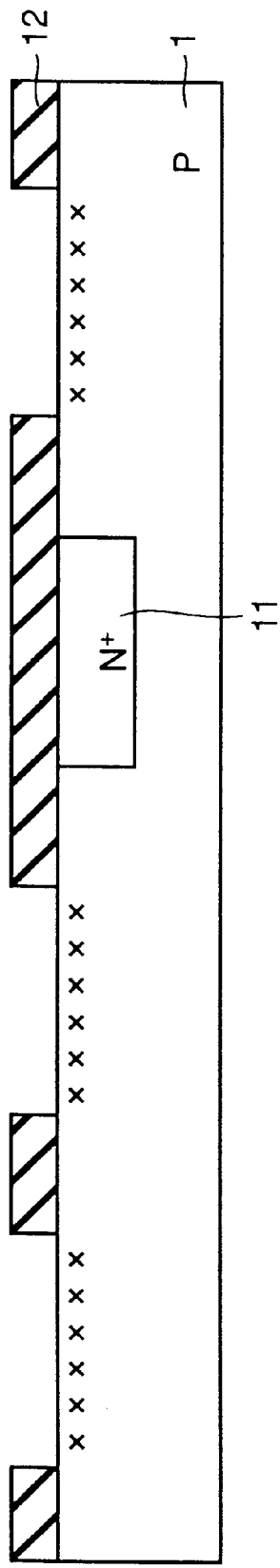
FIG. 5 is a sectional view showing a step following the step shown in FIG. 4 in the embodiment.

Next, as shown in FIG. 5, a silicon oxide film 12 is formed on the p-type silicon substrate 1 to a thickness of about 600 nm. A predetermined photolithographic treatment and etching are applied on the silicon oxide film 12 to expose a surface of the p-type silicon substrate 1. Not only is antimony ion-implanted in the surface layer of the p-type silicon substrate 1 under conditions of an implant energy of 50 KeV and an implant dose of $4\times10^{15}/cm^2$ but a heat treatment is also applied at a temperature of about 1200° C. for about 2 h. With such a procedure, an $N^+$-type buried region 2a is formed.

Figure 6:
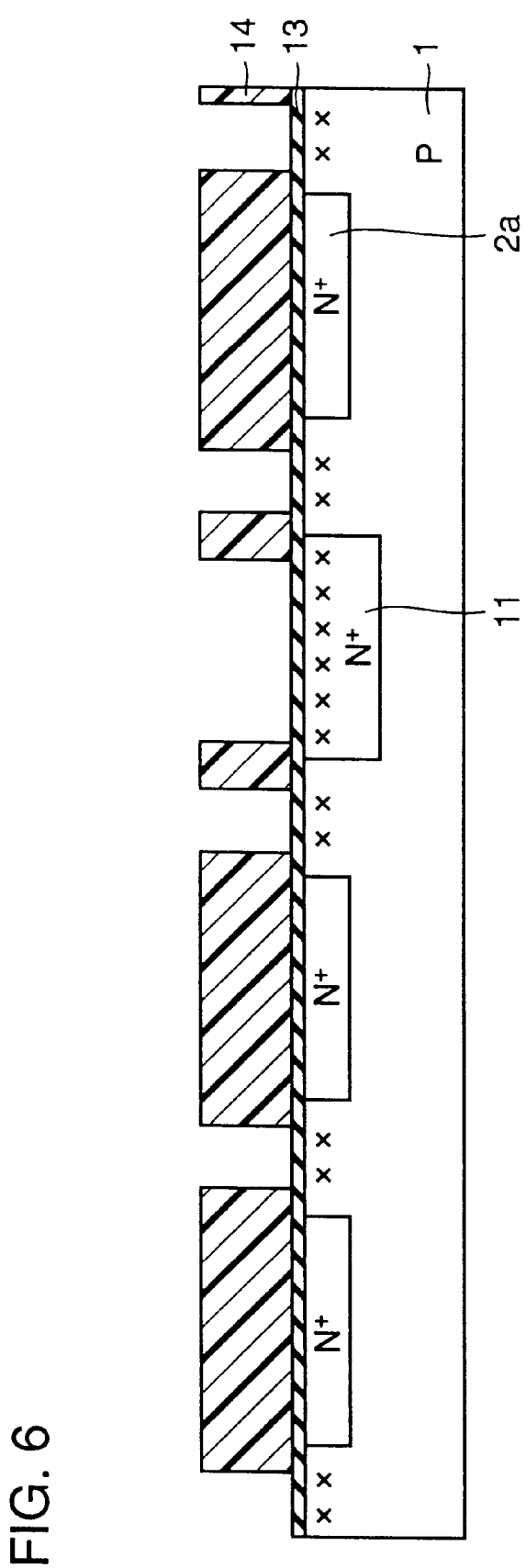
FIG. 6 is a sectional view showing a step following the step shown in FIG. 5 in the embodiment.

Then, as shown in FIG. 6, an underlying oxide film 13 of a thickness of about 100 nm is formed. On the underlying oxide film 13, a predetermined resist mask 14 is formed. With the resist mask 14 as a mask, not only is boron ion-implanted under conditions of an implant energy of 50 KeV and an implant dose of $4\times10^{14}/cm^2$ but a heat treatment is also applied to the p-type silicon substrate 1 at a temperature of about 1000° C. for about 30 min. With such a procedure applied, a region 3a to serve as a lower isolation region is formed.

Figure 7:
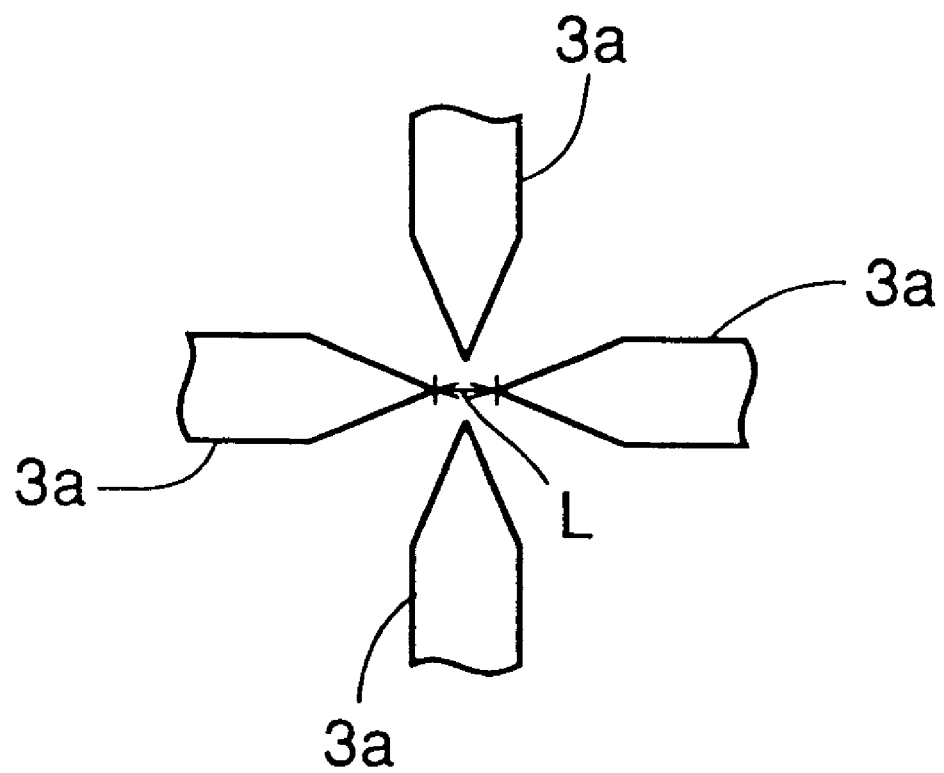
FIG. 7 is a plan view showing a region to serve as a lower isolation region in the step shown in FIG. 6.

The region 3a to serve as the lower isolation region is formed such that fore ends of arms of strip portions of the region are narrowed in width toward the center of an intersection of the strip portions at a final stage of the process and in addition as shown in FIG. 7, opposed arms of each of the strip portions of the region 3a are spaced at a predetermined gap L between the fore-ends thereof, wherein this gap L is about 4.0 μm.

Figure 8:
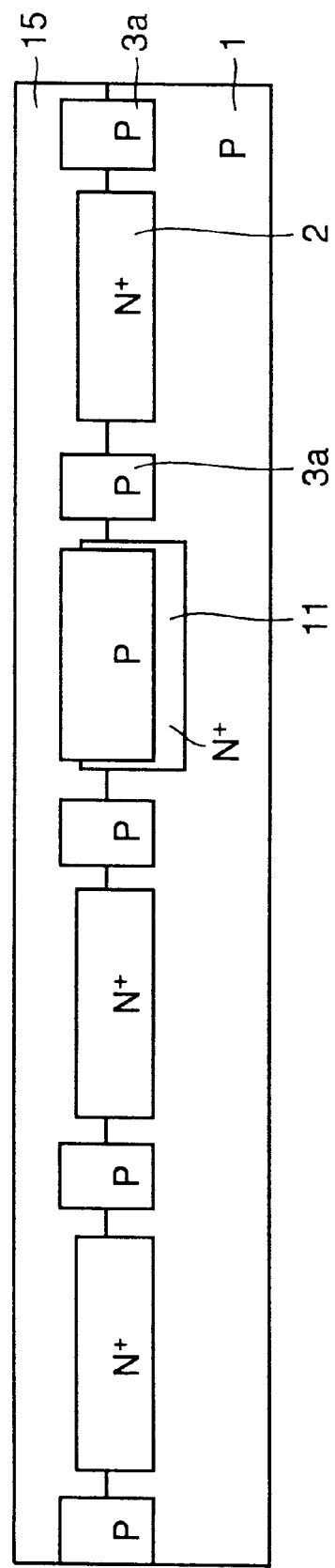
FIG. 8 is a sectional view showing a step following the step shown in FIG. 6 in the embodiment.
Figure 9:
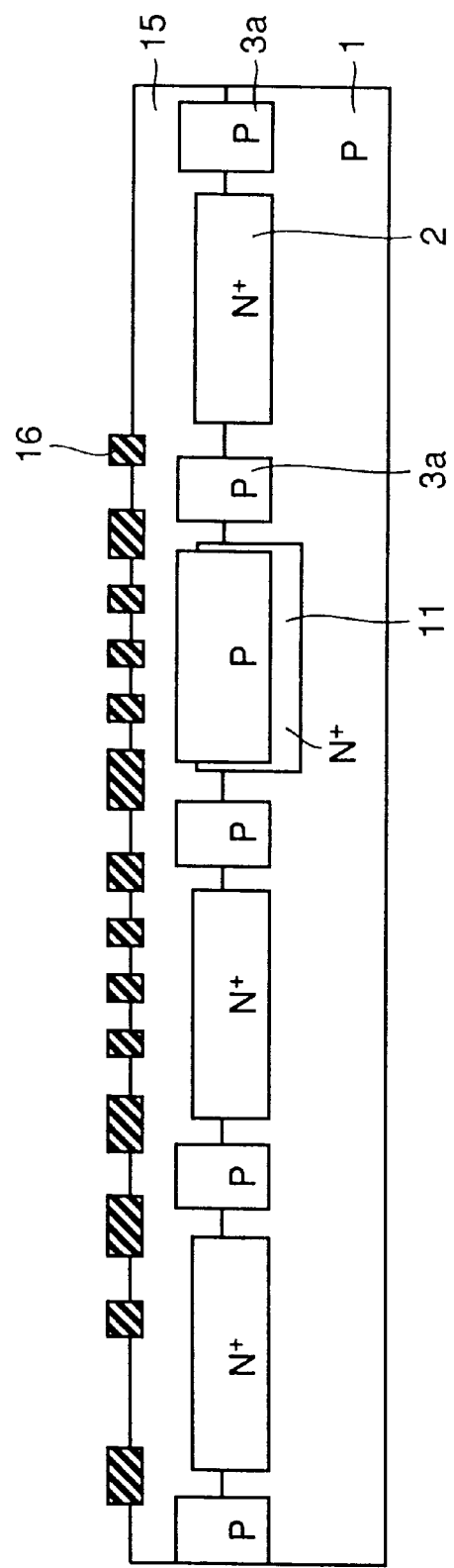
FIG. 9 is a sectional view showing a step following the step shown in FIG. 8 in the embodiment.

Next, as shown in FIG. 8, an n-type epitaxial layer 15 of a film thickness of about 4 μm and a resistivity of 3 Ωcm is formed on the p-type silicon substrate 1. Thereafter, as shown in FIG. 9, a predetermined field oxide film 16 is formed by a field oxidation method.

Figure 10:
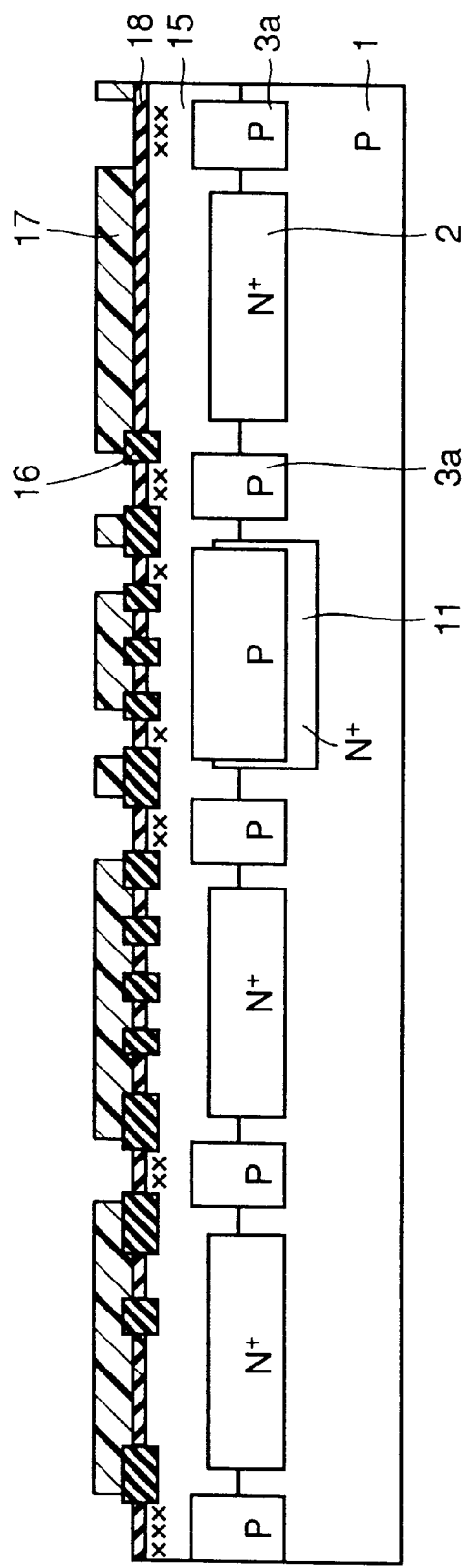
FIG. 10 is a sectional view showing a step following the step shown in FIG. 9 in the embodiment.

After the field oxidation, as shown in FIG. 10, an underlying oxide film 18 is formed to a film thickness of about 50 nm. A predetermined resist mask 17 is formed on the underlying oxide film 18. With the resist mask as a mask 17, not only is boron ion-implanted under conditions of an implant energy of 50 KeV and an implant dose of $4 \times 10^{14}/cm^2$ but a heat treatment is also applied at a temperature of about 1000° C. for about 30 min. With such a procedure, a region 5a to serve as an upper isolation region is formed.

Figure 11:
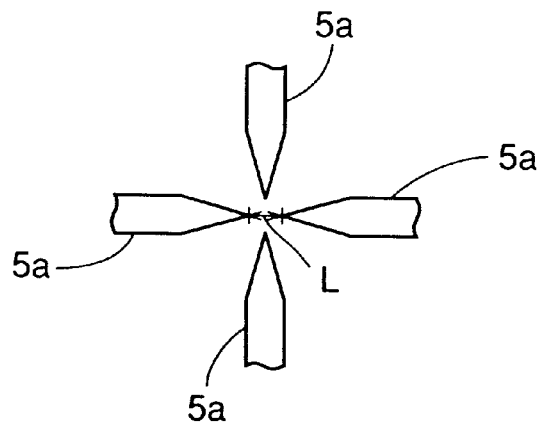
FIG. 11 is a plan view of a region to serve as an upper isolation region in the step shown in FIG. 10.

The region 5a to serve as the upper isolation region, similar to the region 3a to serve as the lower isolation region, as shown in FIG. 11, fore-ends of arms of strip portions of the region 5a are narrowed in width toward the center of an intersection of the strip portions. In addition to this, opposed fore-ends of each pair of arms of strip portions are spaced with a predetermined gap L therebetween. In the case of the region 5a, the predetermined gap L is about 3.0 μm. It should be noted that the reason why a predetermined gap L of the region 3a to serve as an lower isolation region is longer than that of the region 5a to serve as the upper region is that it is taken into consideration that the region 3a is formed earlier than the region 5a by a time length and therefore, a heat treatment is applied to the region 3a in excess corresponding to the time length.

Figure 12:
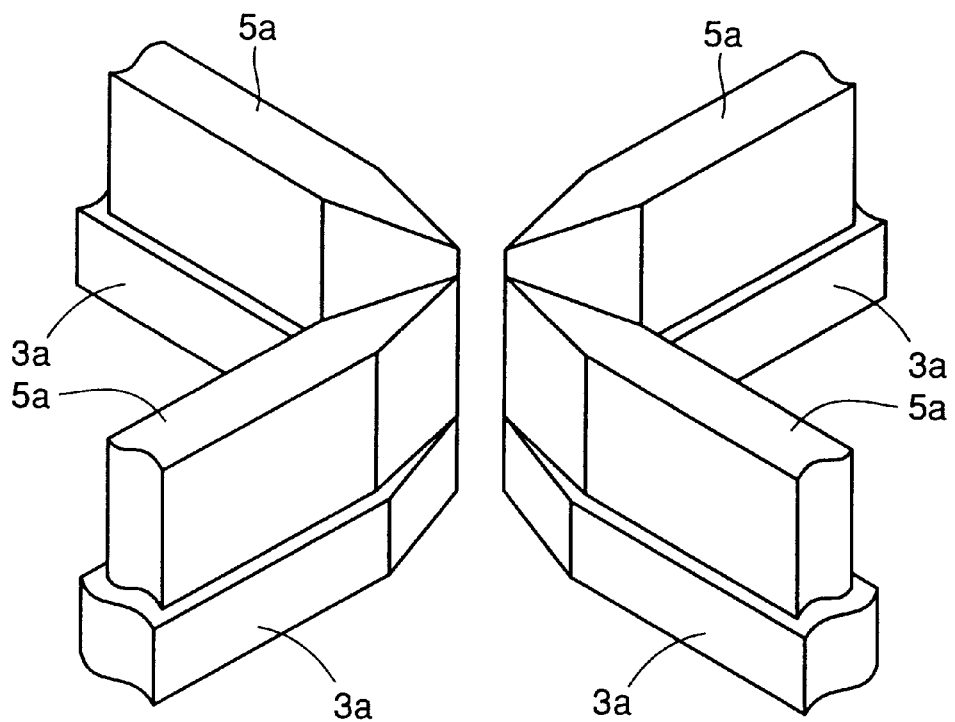
FIG. 12 is a perspective view showing regions to serve as the lower and upper isolation regions in the step shown in FIG. 10.

There is shown in FIG. 12 a structure of a section where the region 3a to serve as the lower isolation region and the region 5a to serve as the upper isolation region are designed to intersect with each other. As shown in FIG. 12, in this stage, no connection in the region 3a or the region 5a arises in a section around a designed intersection of strip portions of the region 3a or the region 5a.

Figure 13:
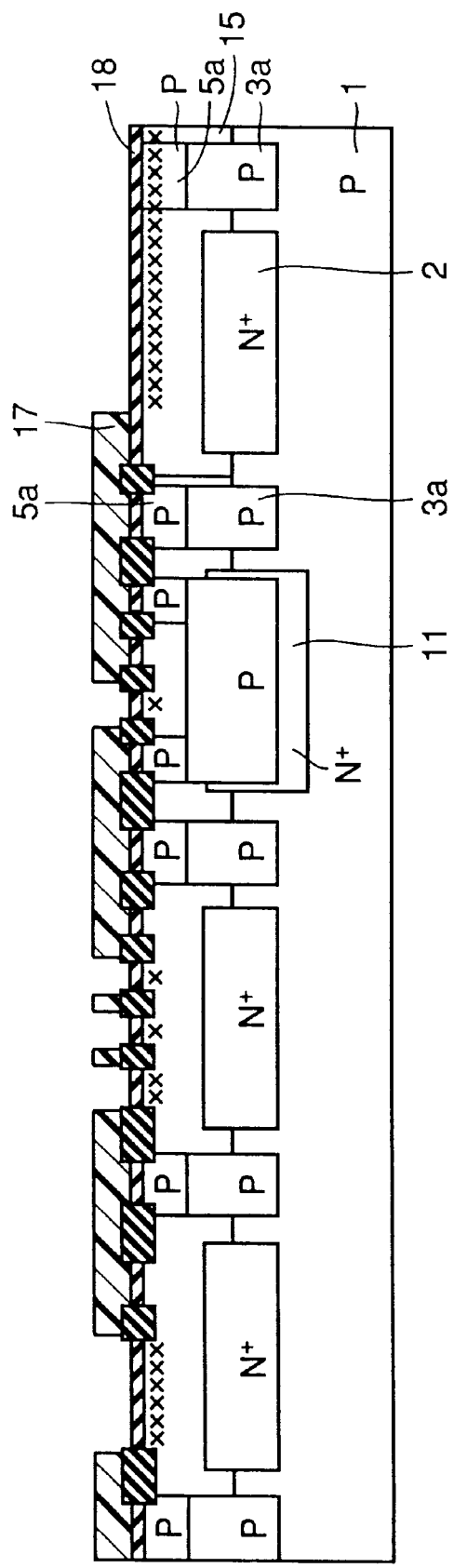
FIG. 13 is a sectional view showing a step following the step shown in FIG. 10 in the embodiment.

Then, as shown in FIG. 13, a resist mask 17 is formed. Using the resist mask 17 as a mask, not only is boron ion-implanted in the n-type epitaxial layer 15 under conditions of an implant energy of 50 KeV and an implant dose of $1 \times 10^{14}/cm^2$ but a heat treatment is also applied at a temperature of about 1000° C. for about 15 min. With such a procedure, in particular, a p-type layer 6 of a photo diode is formed.

Figure 14:
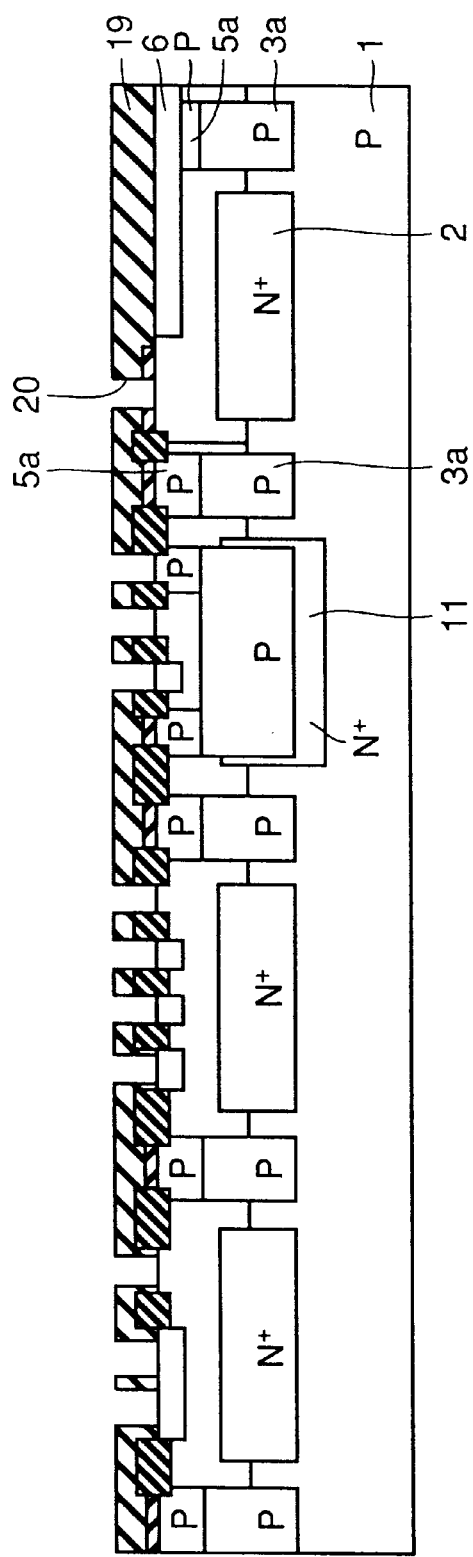
FIG. 14 is a sectional view showing a step following the step shown in FIG. 13 in the embodiment.
Figure 15:
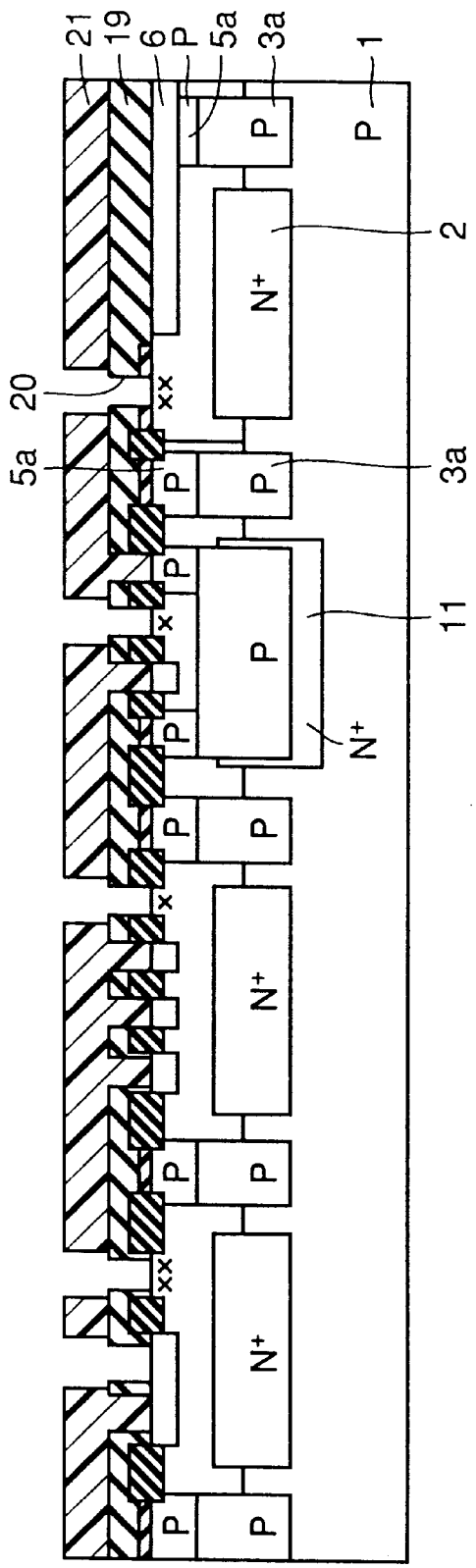
FIG. 15 is a sectional view showing a step following the step shown in FIG. 14 in the embodiment.

Then, as shown in FIG. 14, a silicon oxide film 19 is formed. A predetermined photolithographic treatment and dry etching are applied on the silicon oxide film 19 to form a contact hole 20 exposing a surface of the n-type epitaxial layer 15. Subsequent to this, as shown in FIG. 15, a predetermined photoresist mask 21 is formed.

Using the photoresist mask 21 as a mask, not only is arsenic ion-implanted into the exposed surface of the n-type epitaxial layer 15 under conditions of an implant energy of 50 KeV and an implant dose of $5 \times 10^{15}/cm^2$ but a heat treatment is also applied at a temperature of about 1000° C. for about 20 min. With such a procedure, for example, the emitter region 23 of an NPN transistor is formed.

Figure 16:
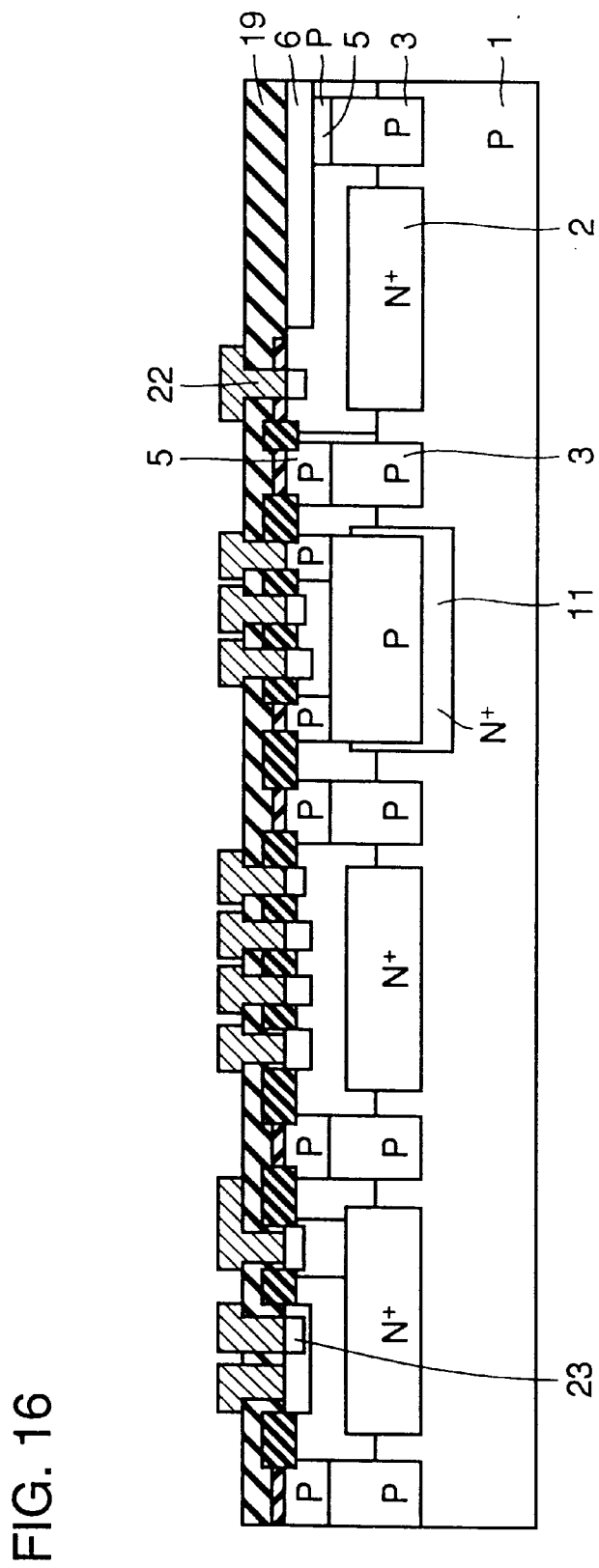
FIG. 16 is a sectional view showing a step following the step shown in FIG. 15 in the embodiment.
Figure 17:
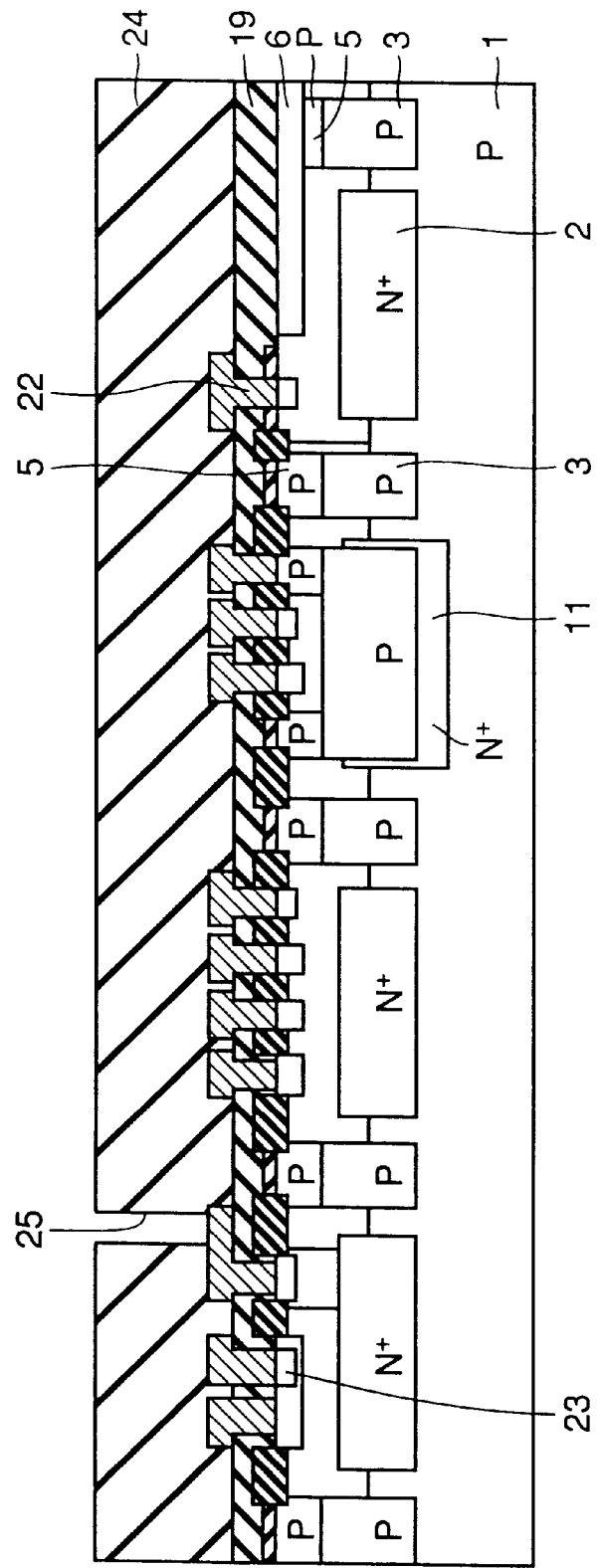
FIG. 17 is a sectional view showing a step following the step shown in FIG. 16 in the embodiment.

Then, as shown in FIG. 16, an aluminum film (not shown) of a film thickness of about 650 nm is formed. A predetermined photolithographic treatment and etching are applied on the aluminum film to form a first aluminum interconnect 22. Thereafter, as shown in FIG. 17, an interlayer silicon oxide film 24 of a film thickness of about 1000 nm is formed. A predetermined photolithographic treatment and etching are applied on the interlayer silicon oxide to form a through hole 25.

Figure 18:
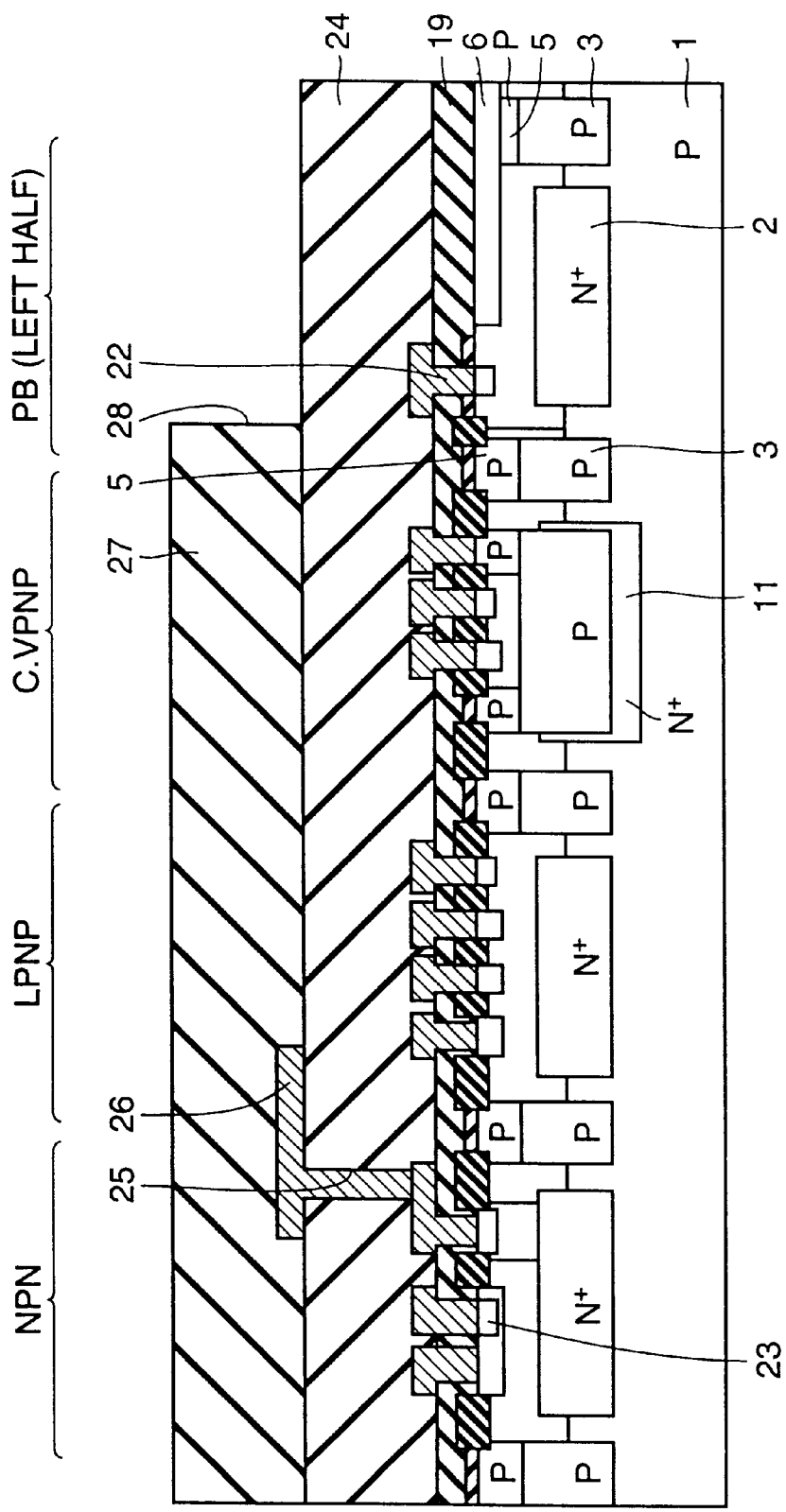
FIG. 18 is a sectional view showing a step following the step shown in FIG. 17 in the embodiment.

Then, as shown in FIG. 18, an aluminum film (not shown) of a film thickness of about 1000 nm is formed. A predetermined photolithographic treatment and etching are applied on the aluminum film to form a second aluminum interconnect 26. Thereafter, a glass coat film 27 of a thickness of about 750 nm is formed. A predetermined photolithographic treatment and etching are applied on the glass coat film 27 to form an opening 28 to expose a surface of the interlayer silicon film 24 under which a photo diode is located. With such a series of fabrication steps applied, a semiconductor device having not only a photo diode PB but also PNP and NPN transistors is completed.

Figure 19:
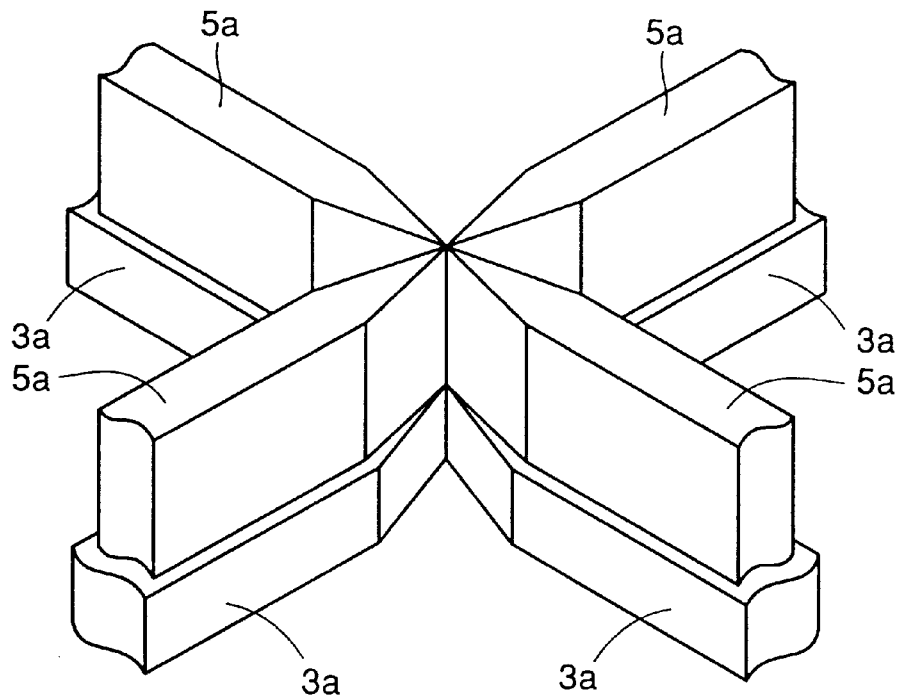
FIG. 19 is a perspective view showing regions to serve as the lower and upper isolation regions in the step shown in FIG. 18.
Figure 20:
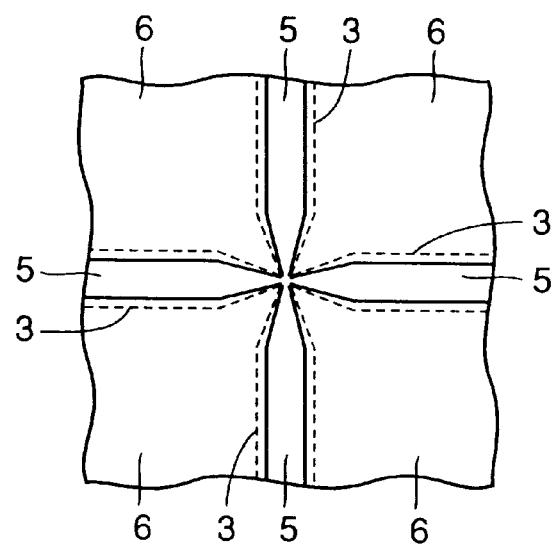
FIG. 20 is a plan view showing the isolation regions in the step shown in FIG. 18.

At the stage of completion of the semiconductor device, in the regions 3a and 5a shown in FIG. 12, opposed fore-ends of arms of strip portions of each of the regions are connected to each other so as to be integral as shown in FIGS. 19 and 20. With this integral connection in each region, the isolation regions 3 and 5 are formed to electrically isolate a plurality of photo diodes individually.

According to the above described fabrication process for a semiconductor device, in formation of the regions 3a and 5a to serve as the lower and upper isolation regions 3 and 5, opposed fore-ends of arms of strip portions of each of the isolation regions 3 and 5, especially, are spaced therebetween by a distance across which the opposed fore-ends of arms of the strip portions are physically connected to each other to be integral after a final step of the process in a section around the designed intersection of the strip portions.

This being compared with a conventional fabrication process therefor, the section around the intersection of strip portions of each of the lower and upper isolation regions 3 and 5, which are completed after the final step of the process, can be prevented from expanding in excess by a heat treatment. With such a structure of the isolation regions, even when illumination with a laser light beam covers the upper and lower isolation regions 3 and 5, photovoltage, as described above, can be produced with good efficiency by electric fields in the depletion layers expanding close to the sections around the intersections of strip portions of the isolation regions 3 and 5. Further, a current follow-up capability to a change in light intensity is improved to enable the semiconductor device to operate at a high frequency.

In this fabrication process, description has been made of the case where arms of strip portions of each of upper and lower isolation regions are narrowed in width toward the center of an intersection of the strip portions in a section around the intersection. Alternatively, a fabrication process may be adopted in which, as described above, arms of strip portions of only one of upper and lower isolation regions are narrowed in width toward the center of an intersection of the strip portions in a section around the intersection.

Then, description will be given of evaluation results in simulation on As shown in the curves A and B, it was confirmed that an isolation region of a structure according to the present invention was operative in a frequency range up to about two times a frequency up to which the conventional structure (the curve C) was operative. Thereby, it was made clear that a current follow-up capability to a change in light intensity of a light beam for illumination was improved and a high-frequency operation was possible.

The curves D, E and F are results of similar evaluation on one half obtained by dividing along the central line of the isolation regions 3 and 5 in a sectional structure corresponding to FIG. 2. Therefore, values of current change rates of the curves D, E and F at the same optical frequency are half the corresponding values of the curves A, B and C, respectively.

Figure 22:
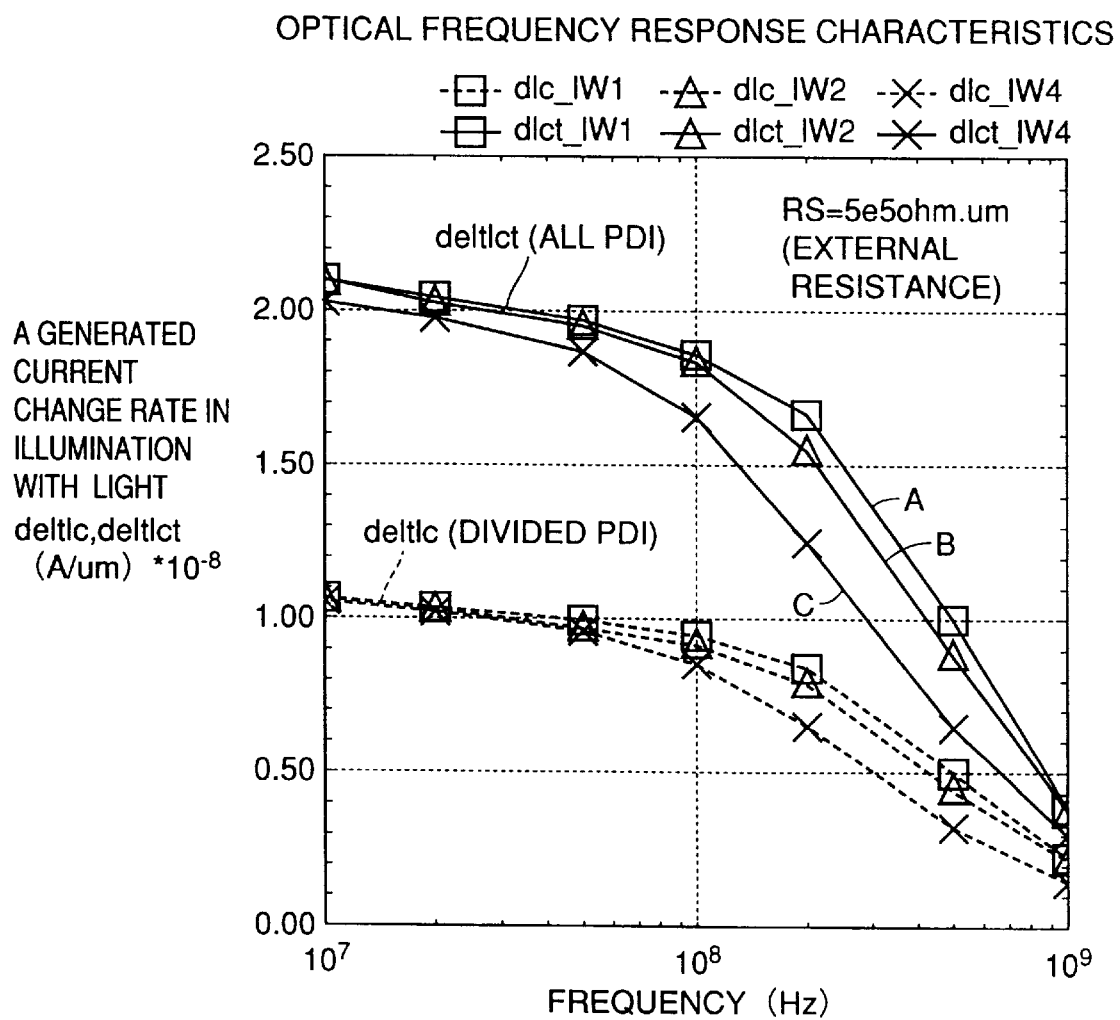
FIG. 22 is a graph showing results of the simulations on optical frequency response characteristics.

Further, an external resistance shown in FIG. 22 corresponds to an external resistance R shown in FIG. 3.

Figure 23:
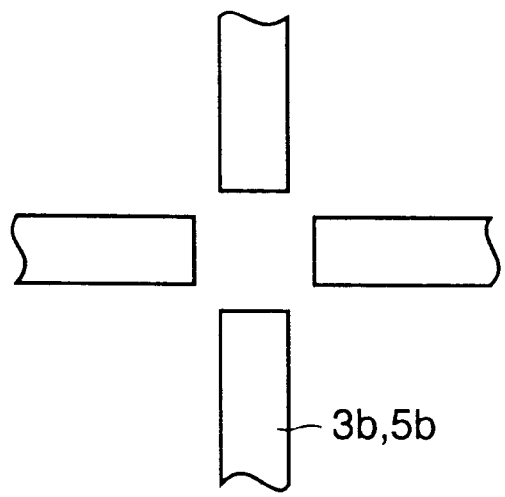
FIG. 23 is a plan view of regions to serve as the upper and lower isolation regions showing a modification of the embodiment.
Figure 24:
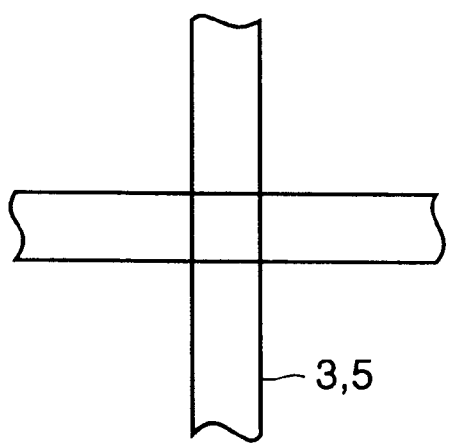
FIG. 24 is a plan view showing a modification of the upper and lower isolation regions.
Figure 25:
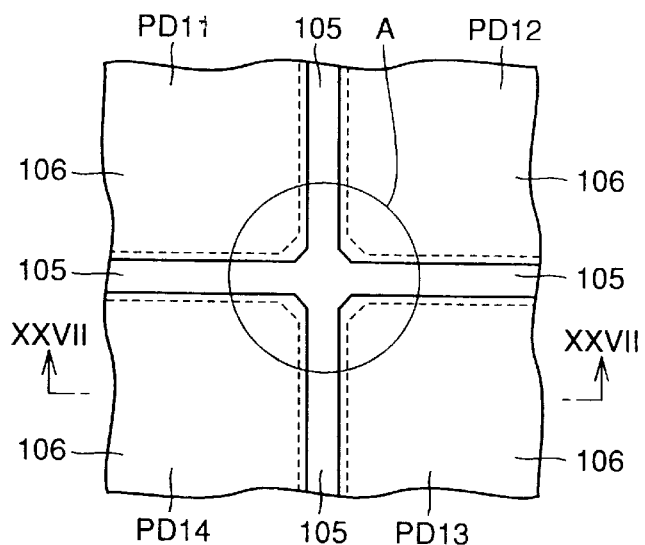
FIG. 25 is a plan view of a conventional semiconductor device.
Figure 26:
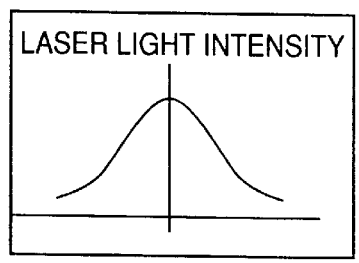
FIG. 26 is a graph showing an intensity distribution of a laser light beam.
Figure 27:
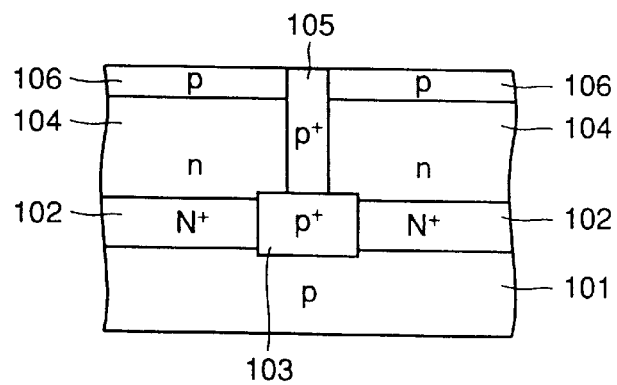
FIG. 27 is a sectional view taken on XXVII—XXVII shown in FIG. 25.
Figure 28:
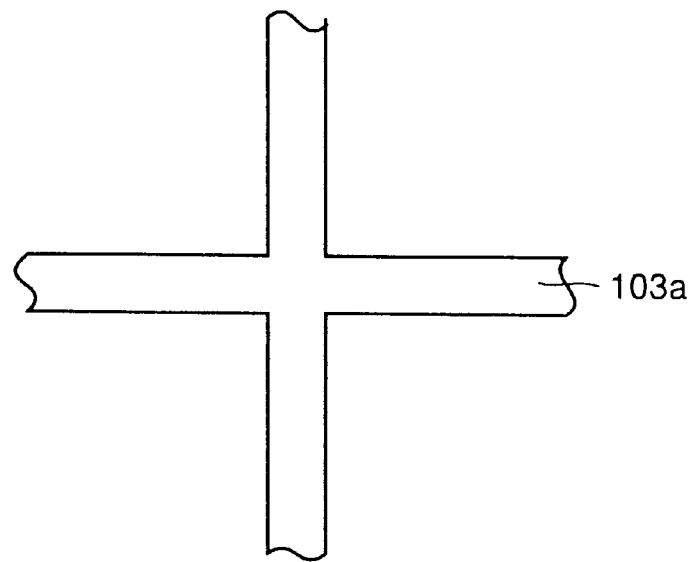
FIG. 28 is a plan view showing a step of a fabrication process for a conventional semiconductor device.
Figure 29:
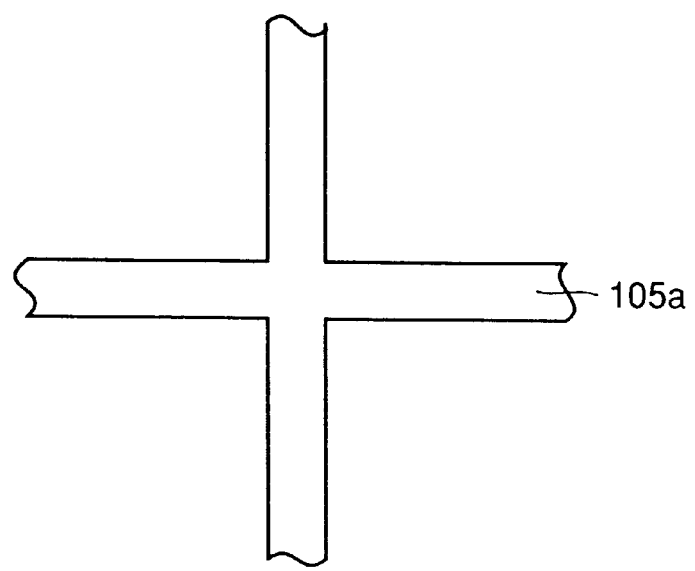
FIG. 29 is a plan view showing a step following the step shown in FIG. 28.

While in the above described embodiment, description has been made of the example having a shape in a section around an intersection of strip portions of an isolation region in which fore-ends of arms of the strip portions are narrowed in width toward the center of the intersection, alternatively, another shape may be adopted in which as shown in FIG. 23, a region 3b to serve as the upper isolation region and a region 5b to serve as the lower isolation region are formed such that fore-ends of arms of strip portions of each of both regions 3b and 5b are originally spaced by a predetermined gap in a section around an intersection of the strip portions, and the fore-ends of arms of the strip portions directed toward the centers of intersections of the strip portions of the upper or lower isolation region are connected to one another so as to be integral in the vicinity of sides of the fore-ends at a final stage as shown in FIG. 24.

In this case as well, compared with a conventional semiconductor device, in the section around an intersection of strip portions of the lower isolation region or the upper isolation region, the strip portions can be prevented from expanding in company with a heat treatment. With such structure, even when illumination with a laser light beam covers the section of an intersection of strip portions of each of the upper and lower optical frequency response characteristics of a photo diode having the above described structure. First, an isolation region is defined by a process simulator (TSUPREM 4 made by Avanti ! Co.) and frequency dependency of a current change rate was evaluated by a device simulator (MEDICI made by Avanti ! Co.) based on data of the isolation region obtained by the process simulator.

Figure 21:
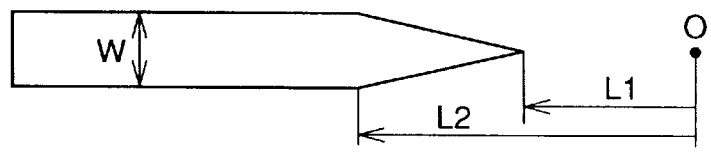
FIG. 21 is a view showing a boundary situation in simulation.

To be more detailed, datas were entered of a region to serve as an isolation region in which fore-ends of arms of strip portions of the region, as shown in FIG. 21, were narrowed in width toward the center O of an intersection of the strip portions. Dimensions in this case were set as follows: in a region to serve as a lower isolation region, a distance L1 was 2.0 µm, a distance L2 was 4.0 µm and a width W of the region was 4.0 µm; and in a region to serve as an upper isolation region, a distance L1 was 1.5 µm, a distance L2 was 3.0 µm and a width W of the region was 2.0 µm. Thereafter, final two-dimensional shape datas of the isolation regions were obtained based on predetermined heat treatment conditions.

Then, with the shape data of the isolation regions thus obtained as the basis, each of two-dimensional shape datas was obtained in a depth direction on a line segment connected between the center of an intersection of strip portions of an isolation region and a center in a width direction of a strip portion of the isolation region. Further, a current change rate was obtained based on the shape datas, which results are shown in FIG. 22.

In FIG. 22, deltIct shows results of optical frequency dependency of a current change rate based on a sectional shape corresponding to FIG. 2. The curve A (a square mark □) is a result for a shape in which arms of strip portions of an isolation region are narrowed in width toward the center of an intersection of the strip portions and in addition, a width is originally set so as to be globally smaller by estimated increase therein through a diffusion of an impurity, the curve B (a triangular mark Δ) is a result for a shape in which arms of strip portions of an isolation region are narrowed in width toward the center of an interconnection of the strip portions and the curve C (a crisscross mark X) is a result for a shape in a case of a conventional isolation region. isolation regions 3 and 5, a useless component of light due to recombination can be reduced to improve a current follow-up capability to a change in light intensity of a laser light beam, thereby enabling a high frequency operation.

Although the present invention has been described and illustrated in detail, it is clearly understood that the same is by way of illustration and example only and is not to be taken by way of limitation, the spirit and scope of the present invention being limited by the terms of the appended claims.

What is claimed is:

1. A semiconductor device, including an isolation region having strip portions that intersect with each other in a plane, comprising:

a first conductivity type semiconductor substrate;

a second conductivity type layer formed on said semiconductor substrate; and a first conductivity type layer formed on said second conductivity type layer;

said isolation region being formed from a surface of said first conductivity layer to a surface of said semiconductor substrate and partitions said first conductivity type and second conductivity type layers into a plurality of regions, and arms of said strip portions of said isolation region being narrowed in width toward a center of an intersection of said strip portions in a section around said intersection.

2. A semiconductor device, including an isolation region having strip portions that intersect with each other in a plane, comprising:

a first conductivity type semiconductor substrate;

a second conductivity type layer formed on said semiconductor substrate; and a first conductivity type layer formed on said second conductivity type layer;

said isolation region includes lower and upper isolation regions, being formed from a surface of said first conductivity layer to a surface of said semiconductor substrate and partitions said first conductivity type and second conductivity type layers into a plurality of regions, and arms of strip portions of at least one of said lower and upper isolation regions being narrowed in width toward a center of an intersection of said strip portions in a section around said intersection.

3. A semiconductor device according to claim 2, wherein said arms of strip portions of each of said lower and upper isolation regions are narrowed in width toward a center of an intersection of said strip portions in a section around said intersection.

4. A fabrication process for a semiconductor device including an isolation region having strip portions that intersect with each other in a plane, comprising the following steps of:

forming a second conductivity type layer on a first conductivity type semiconductor substrate;

forming, in said second conductivity type layer, a first conductivity type region to serve as said isolation region for partitioning said second conductivity type layer into a plurality of regions, from a surface of said second conductivity type layer to a surface of said semiconductor substrate; and forming a first conductivity type layer on and in the vicinity of said second conductivity type layer partitioned by said first conductivity type region;

said step of forming said first conductivity type region including a step of forming said first conductivity type region such that fore-ends of respective opposed arms of each strip portion thereof are spaced by a predetermined gap in the vicinity of a designed intersection of said strip portions of said isolation region, and said predetermined gap being a distance over which said isolation region is partially formed, wherein said fore-ends of said respective opposed arms of each strip portion are connected to each other after a final step of said fabrication process is completed.

5. A fabrication process for a semiconductor device according to claim 4, wherein said step of forming said first conductivity type region includes a step of forming said fore-ends of arms of strip portions thereof so as to be narrowed in width toward the center of a designed intersection of said strip portions, in the vicinity of said designed intersection.

6. A fabrication process for a semiconductor device according to claim 4, wherein said step of forming said first conductivity type region includes a step of forming said first conductivity type region such that fore-ends of arms of strip portions thereof directed to the center of an designed intersection of strip portions of said isolation region are integrally connected with one another in the vicinity of sides of said fore-ends at a final stage in a section around said designed intersection.

7. A fabrication process for a semiconductor device according to claim 4, comprising the steps of:

forming said first conductivity type region;

forming a lower region on said semiconductor substrate; and forming an upper region on said lower region, wherein gaps between said fore-ends of opposed arms of strip portions of said lower regions are set to be larger in width than ones between said fore-ends of opposed arms of strip portions of said upper region in a section around said designed intersection.

* * * * *